(12) United States Patent
Ryou

(10) Patent No.: US 8,769,749 B2
(45) Date of Patent: Jul. 8, 2014

(54) CLEANING DEVICE

(75) Inventor: Dong Young Ryou, Gyeonggi-Do (KR)

(73) Assignee: STS Co., Ltd., Osan, Gyeonggi-Do (KR)

( * ) Notice: Subject to any disclaimer, the term of this patent is extended or adjusted under 35 U.S.C. 154(b) by 665 days.

(21) Appl. No.: 12/997,530

(22) PCT Filed: Jun. 12, 2009

(86) PCT No.: PCT/KR2009/003177
§ 371 (c)(1),
(2), (4) Date: Dec. 10, 2010

(87) PCT Pub. No.: WO2009/151303
PCT Pub. Date: Dec. 17, 2009

(65) Prior Publication Data
US 2011/0094547 A1 Apr. 28, 2011

(30) Foreign Application Priority Data

Jun. 12, 2008 (KR) .......................... 10-2008-055096

(51) Int. Cl.
*D06F 35/00* (2006.01)
(52) U.S. Cl.
USPC ...... 8/158; 134/902; 134/2; 134/34; 134/186; 134/1.1
(58) Field of Classification Search
CPC ..................... Y10S 134/902; H01L 21/67057; B08B 3/10; C23C 16/452; C30B 25/02
USPC ............. 134/166 R, 902, 186, 34, 56 R, 95.1, 134/102.2, 111, 18, 184; 34/364, 576; 118/715; 261/DIG. 65; 427/248.1, 427/255.28; 68/13 R, 18 F, 207
See application file for complete search history.

(56) References Cited

FOREIGN PATENT DOCUMENTS

| KR | 100161865 | 8/1998 | |
|---|---|---|---|
| KR | 100209751 | 4/1999 | |
| KR | 10-2003-0056451 | 7/2003 | |
| KR | 10-2008-0013352 | 2/2008 | |
| WO | WO 2008018729 A1 * | 2/2008 | ................ B08B 3/08 |

OTHER PUBLICATIONS

International Search Report for PCT/KR2009/003177, mailed Jan. 15, 2010.

* cited by examiner

*Primary Examiner* — Michael Barr
*Assistant Examiner* — Thomas Bucci
(74) *Attorney, Agent, or Firm* — Edwards Wildman Palmer LLP

(57) ABSTRACT

A cleaning device for cleaning a mixing vaporizer is provided. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas. The cleaning device cleans the mixing vaporizer by circulating a cleaning solution through at least one the first hole, the second hole, and the third hole.

9 Claims, 3 Drawing Sheets

# CLEANING DEVICE

CROSS-REFERENCES TO RELATED APPLICATIONS

This application is a U.S. national phase application, pursuant to 35 U.S.C. §371, of PCT/KR2009/003177, filed Jun. 12, 2009, designating the United States, which claims priority to Korean Application No. 10-2008-055096, filed Jun. 12, 2008. The entire contents of the aforementioned patent applications are incorporated herein by this reference.

TECHNICAL FIELD

The present invention relates to a cleaning device. More particularly, the present invention relates to a cleaning device for quickly removing an adhered material adhered to an inside of a mixing vaporizer used for a semiconductor process apparatus (such as chemical vapor deposition CVD apparatus) without disassembly of the mixing vaporizer.

BACKGROUND ART

Generally, in a process for manufacturing semiconductor components, unit processes, such as a process for implanting and diffusing dopants, an oxidation process, a process for a chemical vapor deposition, a photolithography process, and a cleaning process, are repeatedly performed.

For example, in the process for the chemical vapor deposition, a gas mixture is deposited onto a surface of a wafer provided in a chamber, in order to form a thin film. A mixing vaporizer is used for providing the gas mixture in the chamber in the process for the chemical vapor deposition. The mixing vaporizer supplies a mixed gas, which a raw material as a material for forming the thin film and a carrier gas as a carrier are mixed and vaporized, to a reaction space.

FIG. 1 is a block diagram illustrating a general semiconductor process apparatus having a mixing vaporizer 100. With reference to FIG. 1, the mixing vaporizer 100 includes a housing 140, a mixing space 130 where the raw material and the carrier gas are mixed to generate the mixed gas, a diaphragm 120 controlling a flux of the mixed gas, and a piezo valve 110 driving the diaphragm 120.

In the conventional chemical deposition process for forming the thin film, since the flux of the raw material per unit time is greatly small, the diaphragm 120 minutely and delicately controls the flux, by using an operation of the piezo valve 110 according to a control part (not shown).

The raw material stored in a raw-material tank 10 is supplied to the mixing space 130 and the carrier gas stored in a carrier gas tank 11 are sprayed to the mixing space 130 through a carrier gas nozzle 150. The mixed gas discharged from the mixing vaporizer 100 is supplied to a chamber 13 through a MFC (mass flow controller) 12.

Generally, the raw material has silicon Si. For example, the raw material is TEOS (OC2H54, tetraethyl orthosilicate). However, in case that the raw material having silicon is used for a long time, an adhered material having silicon is adhered to an inner wall of the mixing vaporizer 100, thereby preventing a flow of the raw material, the carrier gas, and the mixed gas. Finally, the inside of the carrier gas nozzle 150 or the mixing space 130 was blocked by the adhered material, and the mixing vaporizer 100 can not perform the original function. Accordingly, the inside of the mixing vaporizer 100 should be cleaned periodically.

In prior arts, since the structure of install between the mixing vaporizer 100 and the semiconductor process apparatus is complicate, it takes a long time to separate the mixing vaporizer 100, which should be cleaned, from the semiconductor process apparatus. Additionally, it also a takes long time and a lot of effort to disassemble the mixing vaporizer 100, clean the disassembled parts, reassemble the disassemble parts, and install the reassembled mixing vaporizer 100 to the semiconductor process apparatus.

Meanwhile, if the reassembly of the mixing vaporizer 100 is not accurate after disassembling and cleaning, the diaphragm 120 for controlling micro-flux can not be operated appropriately. Thus, when the mixed gas is deposited on the surface of the wafer, particles are generated and the property of the generated film is bad.

Technical Problem

In order to resolve the above problems, the present invention provides a cleaning device allowing that an installation and a separation between a mixing vaporizer and a semiconductor process apparatus can be easily performed, and the adhered material inside the mixing vaporizer can be completely cleaned in a state that the mixing vaporizer is not disassembled.

Technical Solution

A cleaning device for cleaning a mixing vaporizer is provided. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole to supply the carrier gas to the mixing space, and a third hole that discharges the mixed gas. The cleaning device cleans the mixing vaporizer by circulating a cleaning solution through at least one the first hole, the second hole, and the third hole.

Advantageous Effects

According to an embodiment of the present invention, a mixing vaporizer can be easily installed to and separated from a semiconductor process apparatus, and an adhered material adhered to an inside of the mixing vaporizer can be completely removed in a state that the mixing vaporizer is not disassembled. Thus, the efficiency of the cleaning and the yield of semiconductor process are increased.

BEST MODE

Figure 1:
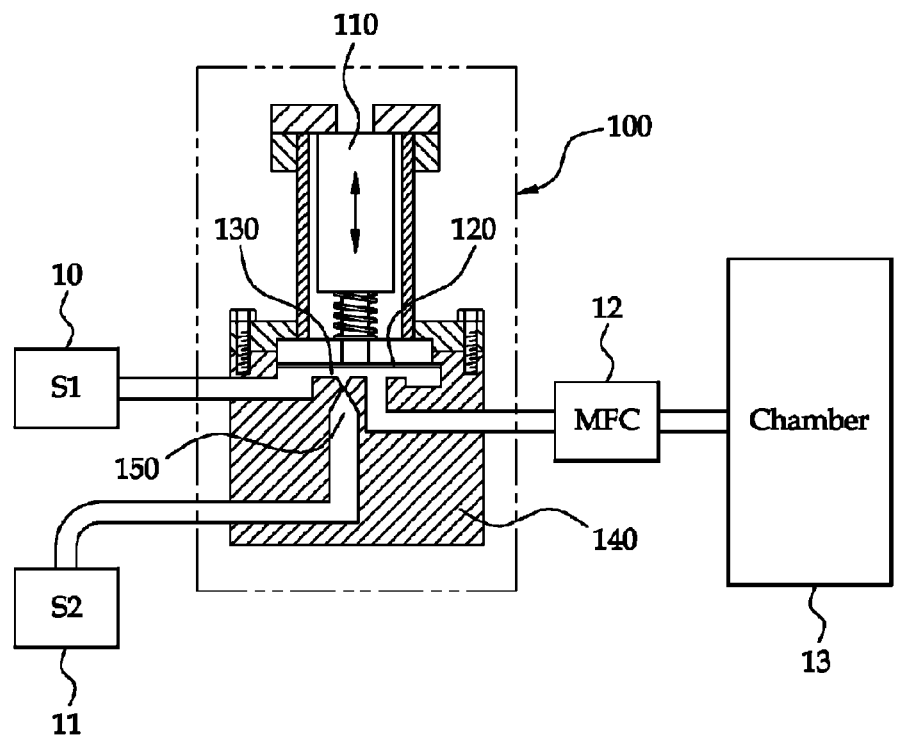
FIG. 1 is a block diagram illustrating a general semiconductor process apparatus having a mixing vaporizer.

As one embodiment, the present invention provides a cleaning device including a cleaning solution tank, a circulation pump, a first pipe, a second pipe, and a third pipe. The cleanings solution tank stores a cleaning solution for a mixing vaporizer. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas. The circulation pump circulates the cleaning solution in the mixing vaporizer. The first pipe connects the first hole to the circulation pump for supplying the cleaning solution to the mixing space. The second pipe connects the second hole to the first pipe for supplying the cleaning solution to the carrier gas nozzle. The third pipe returns the cleaning solution, which is discharged to the third hole via the mixing space, into the cleaning solution tank.

As one embodiment, the present invention provides a cleaning device including a cleaning solution tank, a circulation pump, a first pipe, a second pipe, and a third pipe. The cleanings solution tank stores a cleaning solution for a mixing vaporizer. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas. The circulation pump circulates the cleaning solution in the mixing vaporizer. The third pipe connects the third hole to the circulation pump for supplying the cleaning solution to the mixing space. The second pipe returns the cleaning solution, which is discharged to the second hole via the carrier gas nozzle, into the cleaning solution tank. The first pipe returns the cleaning solution, which is discharged to the first hole via the mixing space, into the cleaning solution tank.

As one embodiment, the present invention provides a cleaning device including a cleaning solution tank, a circulation pump, and a direction-changing member. The cleanings solution tank stores a cleaning solution for a mixing vaporizer. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas. The circulation pump circulates the cleaning solution in the mixing vaporizer. During a circulation in a normal direction, the direction-changing member connects the first hole and the second hole to the circulation pump and connects the third hole to the cleaning solution tank. During a circulation in a reverse direction, the direction-changing member connects the third hole to the circulation pump and connects the first hole and the second hole to the cleaning solution tank. The mixing vaporizer is cleaned along the normal direction and the reverse direction by the direction-changing member.

As one embodiment, the present invention provides a cleaning device including a cleaning solution tank, a water tank, a circulation pump, and a selection member. The cleanings solution tank stores a cleaning solution for a mixing vaporizer. The mixing vaporizer includes a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas. The deionized-water tank stores deionized water for cleaning the mixing vaporizer. The circulation pump circulates the cleaning solution or the deionized water in the mixing vaporizer. When the cleaning solution is circulated, the selection member connects the circulation pump to the cleaning solution tank and returns the cleaning solution, which is discharged from the mixing vaporizer, into the cleaning solution tank. When the deionized water is circulated, the selection member connects the circulation pump to the deionized-water tank and returns the deionized water, which is discharge from the mixing vaporizer, into the deionized-water tank.

MODE FOR INVENTION

Hereinafter, embodiments will be described in detail with reference to accompanying drawings. The shape and size of each element shown in the drawings may be exaggerated, and thus the size of the element does not utterly reflect an actual size. The specific terms defined considering the constitution of the operation of the present invention may vary according to intends of a user and an operator, or convention. Thus, the definition of the terms should be based on the contents of the overall specification.

Figure 2:
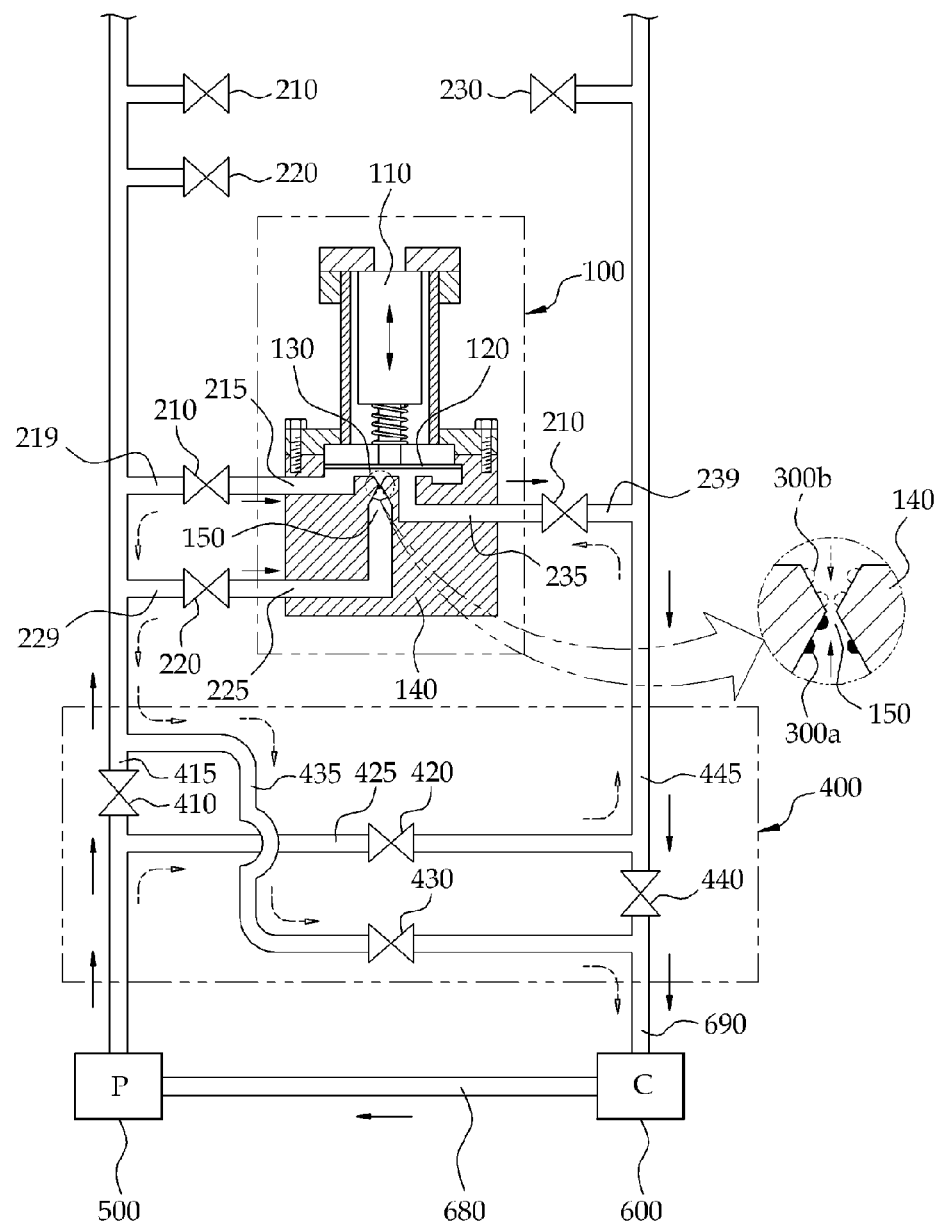
FIG. 2 is a block diagram illustrating a cleaning device according to an embodiment of the present invention.
Figure 3:
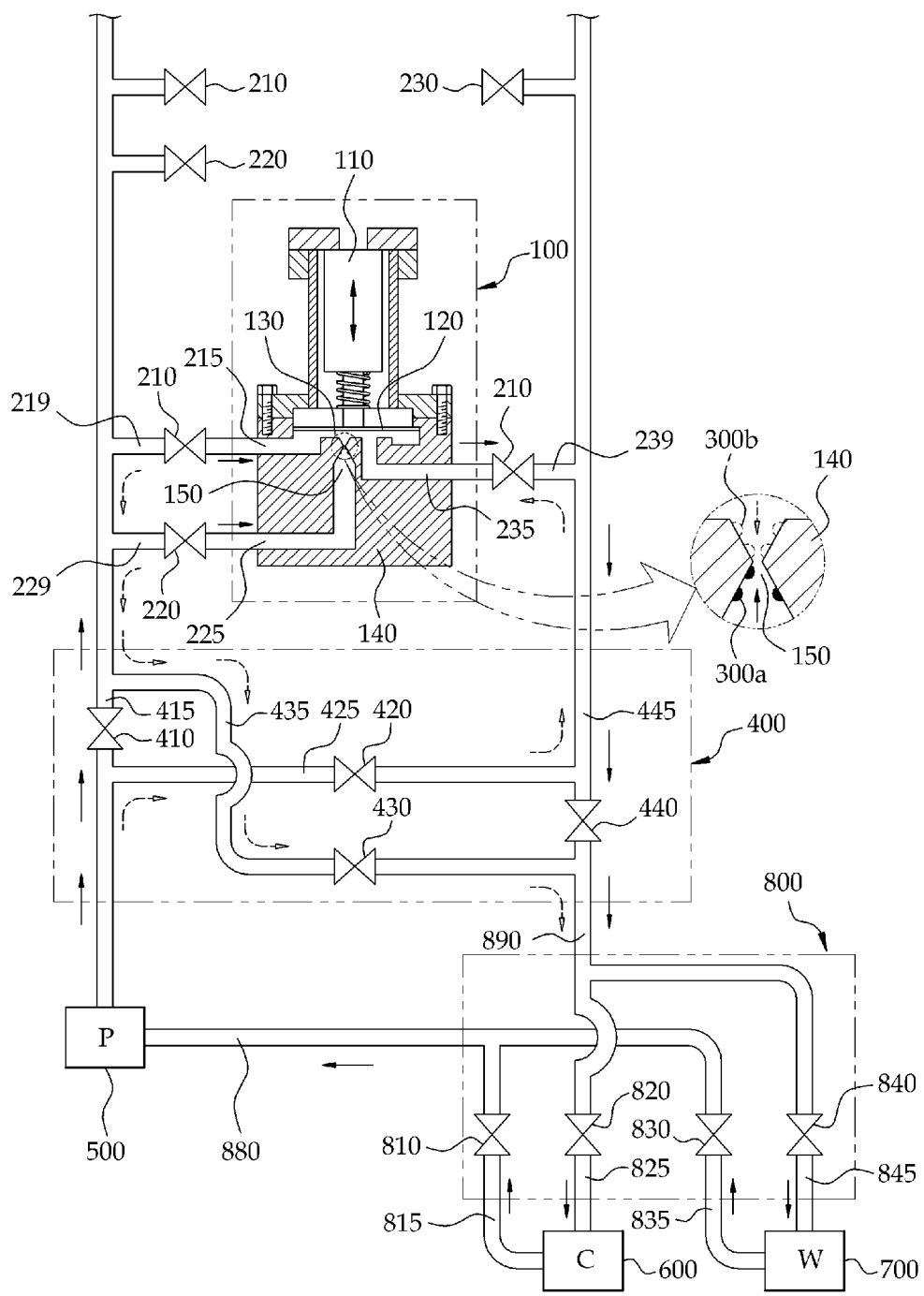
FIG. 3 is a block diagram illustrating a cleaning device according to another embodiment of the present invention.

FIG. 2 is a block diagram illustrating a cleaning device including cleaning a solution tank 600, a circulation pump 500, and a direction-changing member 400, according to an embodiment of the present invention. FIG. 3 is a block diagram illustrating a cleaning device including a cleaning solution tank 600, a deionized-water tank 700, a selection member 800, a circulation pump 500, and a direction-changing member 400, according to another embodiment of the present invention.

The mixing vaporizer 100 shown in FIG. 1, which is separated from the conventional semiconductor process apparatus, is connected to and cleaned by the cleaning device shown in FIG. 2 or FIG. 3 in a state that the mixing vaporizer is not disassembled. In addition, one or more the mixing vaporizer 100 may be connected to the cleaning device of the present invention, and thus one or more mixing vaporizer 100 may be cleaned at the same time.

A cleaning solution used for the cleaning device according to the present invention includes fluorine F. It is because the adhered material including silicon and adhered to the inner wall of the mixing vaporizer 100 is reacted with the fluorine, and the adhered material can be easily detached from the inner wall of the mixing vaporizer 100 and be discharged.

The cleaning solution may include at least one of hydrofluoric acid (HF), ammonium hydrogen fluoride (NH4HF2), and tetrahydrofuran (THF). In one embodiment, the cleaning solution is a water solution that water and ammonium hydrogen fluoride (NH4HF2) are mixed with each other a weight ratio as follows:

Water (H20):ammonium hydrogen fluoride (NH4HF2) 10:1

The cleaning solution tank 600 stores the cleaning solution. The inner wall of the cleaning solution tank 600 is formed of a corrosion proof material or is treated by the corrosion proof treatment. It is preferable that the cleaning solution tank 600 has a size that can sufficiently store the cleaning solution for cleaning the mixing vaporizer 100.

First, with reference to FIG. 2, an embodiment of the cleaning device will be described. The cleaning device shown in FIG. 2 includes the cleaning solution tank 600 for storing the cleaning solution, the circulation pump 500 for circulating the cleaning solution. The cleaning device may further include the direction-changing member 400 for changing a direction of the flow of the cleaning solution in a normal direction or in a reverse direction.

The detailed structure of the mixing vaporizer 100 is as follows. The mixing vaporizer 100 is provided with a housing 140, a first hole 215 that a raw material flows in therethrough, a second hole 225 that carrier gas flows in therethrough, a mixing space 130 that generates the mixed gas by mixing the raw material and the carrier gas, a carrier gas nozzle 150 that supplies the carrier gas to the mixing space 130, a third hole 235 that discharges the mixed gas generated from the mixing space 130 to the outside, and a piezo valve 110 and a diaphragm 120 minutely and delicately controlling the flux of the mixed gas.

The install method between the mixing vaporizer 100 and the cleaning device is as follows. The mixing vaporizer 100 can be easily installed to the cleaning device by connecting the first hole 215, the second hole 225, and the third hole 235 to a first valve 210, a second valve 220, and a third valve 230, respectively. Similarly, the mixing vaporizer 100 can be easily separated from the cleaning device by separating the first hole 215, the second hole 225, and the third hole 235 from the first valve 210, the second valve 220, and the third valve 230, respectively.

Although it is not shown, the above install method may be applied when the mixing vaporizer is separated from the semiconductor process apparatus, or when the mixing vaporizer cleaned by the cleaning device is installed to the semiconductor process apparatus. Thus, the time and the effort can be greatly reduced during the processes that the mixing vaporizer is separated from and installs to the cleaning device.

Also, the cleaning device is provided with a first pipe 219, a second pipe 229, and a third pipe 239. The first pipe 219 is detachably connected to the first hole 215 of the mixing vaporizer 100 through the first valve 210. One end of the second pipe 229 is communicated with the first pipe 219, and the other end of the second pipe 229 is detachably connected to the second hole 225 through the second valve 220. The third pipe 239 is detachably connected to the third hole 235 through the third valve 230.

As an example, a location where the adhered material is formed is shown in the inside of the dotted line of FIG. 2. That is, the adhered material of the carrier gas nozzle 150 (that is, the adhered material 300*a*) and the adhered material of the mixing space 130 (that is, the adhered material 300*b*) are shown as a representative example. In order to remove the adhered materials 300*a* and 300*b* effectively (that is, in order to remove the adhered material 300*a* and 300*b* regardless their location), the cleaning solution desirably flows in various direction. For this, the present invention further includes the direction-changing member 400.

When the direction-changing member 400 circulates the deionized water (or ultra-pure deionized water) that will be described in a later or the cleaning solution in the normal direction, the mixing vaporizer 100 can be cleaned in the normal direction. Similarly, when the direction-changing member 400 circulates the deionized water or the cleaning solution in the reverse direction, the mixing vaporizer 100 can be cleaned in the reverse direction.

The direction-changing member 400 connects the first hole 215 and the second hole 225 to the circulation pump 500, and connects the third hole 235 to the cleaning solution tank 600 during the circulation in the normal direction. Also, the direction-changing member 400 connects the third hole 235 to the circulation pump 500 and connects the first hole 215 and the second hole 225 to the cleaning solution tank 600 during the circulation in the reverse direction, As an embodiment, the direction-changing member 400 includes a first direction-changing valve 410 provided between the circulation pump 500 and the first pipe 219, a second direction-changing valve 420 provided between the circulation pump 500 and the third pipe 239, a third direction-changing valve 430 provided between the first pipe 219 and the cleaning solution tank 600, and a fourth direction-changing valve 440 provided between the cleaning solution tank 600 and the third pipe 239.

During the cleaning in the normal direction (the lined arrow of FIG. 2), the second direction-changing valve 420 and the third direction-changing valve 430 are close, and the first direction-changing valve 410 and the fourth direction-changing valve 440 are open. Then, the cleaning solution is supplied to the mixing vaporizer 100 through a pipe 415 connected to the first direction-changing valve 410, and the cleaning solution is returned to the cleaning solution tank 600 through a pipe 445 connected to fourth direction-changing valve 440. That is, the cleaning solution flows in a direction that the adhered material 300*a* adhered to the carrier gas nozzle 150 can be easily removed.

During the cleaning in the reverse direction (the dotted arrow of FIG. 2), the first direction-changing valve 410 and the fourth direction-changing valve 440 are close, and the second direction-changing valve 420 and the third direction-changing valve 430 are open. Then, the cleaning solution is supplied to the mixing vaporizer 100 through a pipe 425 connected to the second direction-changing valve 420, and the cleaning solution is returned to the cleaning solution tank 600 through a pipe 435 connected to third direction-changing valve 430. That is, the cleaning solution flows in a direction that the adhered material 300*b* adhered to the mixing space 130 can be easily removed.

Taken as a whole, during the circulation in the normal direction, the cleaning solution or the deionized water that flows in through the first hole 215 or the second hole 225 passes the mixing space 130. Then, the cleaning solution or the deionized water effectively removes the adhered material formed on the inner wall from the first hole 215 to the mixing space 130 and the inner wall from the second hole 225 to the carrier gas nozzle 150. Also, the adhered material formed on the inner wall from the mixing space 130 to the third hole 235 can be also removed.

During the circulation in the reverse direction, the cleaning solution or the deionized water that flows in through third hole 235 passes the mixing space 130. Then, cleaning solution or the deionized water effectively removes the adhered material formed on the inner wall from the third hole 235 to the mixing space 130. Also, the adhered material formed on the inner wall from the first hole 215 to the mixing space 130 and the inner wall from the second hole 225 to the carrier gas nozzle 150 can be also removed.

During the cleaning in the normal direction, the direction-changing member 400 forms a course of the cleaning solution as follows. The cleaning solution is supplied from the cleaning solution tank 600 to the circulation pump 500 via a pipe 680. The first pipe 219 connects the circulation pump 500 to the first hole 215, and the cleaning solution is supplied to the mixing space 130. The second pipe 229 connects the first pipe 219 to the second hole 225, and the cleaning solution is supplied to the carrier gas nozzle 150. The third pipe 239 connects the third hole 235 to the cleaning solution tank 600, and the cleaning solution that is discharged to the third hole 235 via the mixing space 130 is returned to the cleaning solution tank 600 through a pipe 690.

During the cleaning in the reverse direction, the direction-changing member 400 forms a course of the cleaning solution as follows. The cleaning solution is supplied from the cleaning solution tank 600 to the circulation pump 500 via the pipe 680. The third pipe 239 connects the circulation pump 500 to the third hole 235, and the cleaning solution is supplied to the mixing space 130. The second pipe 229 connects the first pipe 219 to the second hole 225, and the cleaning solution that is discharged to the second hole 225 via the carrier gas nozzle 150 is returned to the cleaning solution tank 500. The first pipe 219 connects the first hole 215 to the cleaning solution tank 600, and the cleaning solution that is discharged to the first hole 235 via the mixing space 130 is returned to the cleaning solution tank 600 through the pipe 690.

FIG. 3 is a block diagram illustrating a cleaning device according to another embodiment of the present invention. In the embodiment, a selection member 800 is further included. The selection member 800 selects at least one of the deionized water and the cleaning solution as a fluid for cleaning the mixing vaporizer 100. When the cleaning by the circulation of the cleaning solution finishes, the selection member 800 may select the deionized water, and thus the rinsing/cleaning may be performed by the deionized water. The selection member 800 supplies the mixture of the cleaning solution and the deionized water with a predetermined ratio to the circulation pump 500 for controlling a concentration of the cleaning solution when it is required.

Meanwhile, the constitution and the operation of the direction-changing member 400 shown in FIG. 3 similar to or the same as the direction-changing member 400 shown in FIG. 2 will be omitted. Here, the direction-changing member 400 allows the cleaning in the normal and reverse directions by the deionized water, as well as by the cleaning solution.

That is, during the circulation in the normal direction, the direction-changing member 400 connects the first hole 215 and the second hole 225 to the circulation pump 500 and connects the third hole 235 to the selection member 800. During the circulation in the reverse direction, the direction-changing member 400 connects the third hole 235 to the circulation pump 500 and connects the first hole 215 and the second hole 225 to the selection member 800.

When the cleaning solution is circulated, the selection member 800 connects the circulation pump 500 to the cleaning solution tank 600, and returns the cleaning solution, which is discharged from the mixing vaporizer 100, into the cleaning solution tank 600. When the deionized water is circulation, the selection member connecting 800 connects the circulation pump 500 to the deionized-water tank 700, and returns the pure water, which is discharge from the mixing vaporizer 100, into the deionized-water tank 700.

As one embodiment, the selection member 800 includes a first selection valve 810, a second selection valve 820, a third selection valve 820, a fourth selection valve 840, a pipe 825, a pipe 825, a pipe 835, and a pipe 845. The second and fourth selection valves 820 and 840 are connected to the pipe 890 where the deionized water or the cleaning solution is returned. The first and third selection valves 810 and 830 are connected to the pipe 880 where the deionized water or the cleaning solution is supplied. The pipe 815 connects the first selection valve 810 to the cleaning solution tank 600. The pipe 825 connects the second selection valve 820 to the cleaning solution tank 600. The pipe 835 connects the third selection valve 830 to the deionized water tank 700. The pipe 845 connects the fourth selection valve 840 to the deionized water tank 700.

Thus, when the selection member 800 selects the cleaning by the cleaning solution, the third selection valve 830 and the fourth selection valve 840 are close. Then, the cleaning solution is supplied to the circulation pump 500 via the first selection valve 810, and is return to the cleaning solution tank 600 via the second selection valve 820.

When the selection member 800 selects the cleaning by the deionized water, the first selection valve 810 and the second selection valve 820 are close. Then, the cleaning solution is supplied to the circulation pump 500 via the third selection valve 830, and is return to the deionized water 700 via the fourth selection valve 840.

When the selection member 800 selects the cleaning by the mixture of the cleaning solution and the deionized water as necessary, the first selection valve 810 and the third selection valve 830 are open by a predetermined degree. Then, the mixture of the cleaning solution and the deionized water with a predetermined ratio is supplied to the circulation pump 500. Depending on a location where the mixture is returned, the mixture is returned to the cleaning solution tank 600, deionized water tank 700, or another return tank (not shown) by controlling the third selection valve 830, the fourth selection valve 840, or another return valve (not shown).

As an exemplary embodiment, the cleaning solution was flows through the first pipe 219, the second pipe 229, the third pipe 239 with a pressure of 2.5 kgf/cm$^2$. In the cleaning solution, the weight ratio of water (H20):ammonium hydrogen fluoride (NH4HF2) was 10:1. Then, it took about two (2) days to completely clean the mixing vaporizer 100.

Although embodiments have been described with reference to a number of illustrative embodiments thereof, it should be understood that various variations and modifications can be derived by those skilled in the art that will fall within the spirit and scope of the principles of this disclosure. Thus, the scope of the invention is defined as the appended claims.

The invention claimed is:

1. A cleaning device for cleaning a mixing vaporizer, wherein the mixing vaporizer comprises a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas,
wherein the cleaning device cleans the mixing vaporizer by circulating a cleaning solution through at least one the first hole, the second hole, and the third hole,
wherein the cleaning device comprises:
a cleaning solution tank for storing the cleaning solution;
a circulation pump for circulating the cleaning solution in the mixing vaporizer; and
a direction-changing member, wherein the direction-changing member connecting the first hole and the second hole to the circulation pump and connecting the third hole to the cleaning solution tank during a circulation in a normal direction, and the direction-changing member connecting the third hole to the circulation pump and connecting the first hole and the second hole to the cleaning solution tank during a circulation in a reverse direction,
wherein the mixing vaporizer is cleaned along the normal direction and the reverse direction by the direction-changing member.

2. The cleaning device according to claim 1, further comprising:
a first pipe detachably connected to the first hole;
a second pipe including one end communicated with the first pipe and the other end detachably connected to the second hole; and
a third pipe detachably connected to the third hole.

3. The cleaning device according to claim 2,
wherein the direction-changing member, a first direction-changing valve provided between the circulation pump and the first pipe, a second direction-changing valve provided between the circulation pump and the third pipe, a third direction-changing valve provided between the first pipe and the cleaning solution tank, and a fourth direction-changing valve provided between the cleaning solution tank and the third pipe, wherein the second direction-changing valve and the third direction-changing valve are close during the circulation in the normal direction, and wherein the first direction-changing valve and the fourth direction-changing valve are close during the circulation in the reverse direction.

4. A cleaning device, comprising:

a cleaning solution tank storing a cleaning solution for cleaning a mixing vaporizer, wherein the mixing vaporizer comprising a first hole that a raw material flows in therethrough, a second hole that carrier gas flows in therethrough, a mixing space that generates mixed gas by mixing the raw material and the carrier gas, a carrier gas nozzle that is connected to the second hole for supplying the carrier gas to the mixing space, and a third hole that discharges the mixed gas, a deionized-water tank storing deionized water for cleaning the mixing vaporizer;

a circulation pump circulating the cleaning solution or the deionized water in the mixing vaporizer; and a selection member, the selection member connecting the circulation pump to the cleaning solution tank for returning the cleaning solution, which is discharged from the mixing vaporizer, into the cleaning solution tank when the cleaning solution is circulated, and the selection member connecting the circulation pump to the deionized-water tank for returning the deionized water, which is discharge from the mixing vaporizer, into the deionized-water tank when the deionized water is circulated.

5. The cleaning device according to claim 4, further comprising:

a direction-changing member, the direction-changing member connecting the first hole and the second hole to the circulation pump and connecting the third hole to the selection member during a circulation in a normal direction, and the direction-changing member connecting the third hole to the circulation pump and connecting the first hole and the second hole to the selection member during a circulation in a reverse direction, wherein the mixing vaporizer is cleaned along the normal direction and the reverse direction by the direction-changing member.

6. The cleaning device according to claim 5, further comprising:

a first pipe detachably connected to the first hole;

a second pipe including one end communicated with the first pipe and the other end detachably connected to the second hole; and a third pipe detachably connected to the third hole.

7. The cleaning device according to claim 6, wherein the direction-changing member comprises a first direction-changing valve provided between the circulation pump and the first pipe, a second direction-changing valve provided between the circulation pump and the third pipe, a third direction-changing valve provided between the first pipe and the selection member, and a fourth direction-changing valve provided between the selection member and the third pipe, wherein the second direction-changing valve and the third direction-changing valve are close during the circulation in the normal direction, and wherein the first direction-changing valve and the fourth direction-changing valve are close during the circulation in the reverse direction.

8. The cleaning device according to claim 4 or claim 7, wherein the cleaning solution comprises fluorine F.

9. The cleaning device according to claim 1 or claim 4, wherein the cleaning solution comprises at least one of hydrofluoric acid HF, ammonium hydrogen fluoride NH4HF2, and tetrahydrofuran THF.

* * * * *